United States Patent
Hashimoto

(10) Patent No.: US 8,040,731 B2
(45) Date of Patent: Oct. 18, 2011

(54) NONVOLATILE SEMICONDUCTOR MEMORY

(75) Inventor: Toshifumi Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 12/639,286

(22) Filed: Dec. 16, 2009

(65) Prior Publication Data

US 2010/0165735 A1   Jul. 1, 2010

(30) Foreign Application Priority Data

Dec. 26, 2008 (JP) ................................. 2008-333954

(51) Int. Cl.
*G11C 11/34* (2006.01)
(52) U.S. Cl. ............................. 365/185.18; 365/185.17
(58) Field of Classification Search ............. 365/185.17, 365/185.18
See application file for complete search history.

(56) References Cited

U.S. PATENT DOCUMENTS
7,433,236 B2 * 10/2008 Ha et al. ................... 365/185.18

FOREIGN PATENT DOCUMENTS
JP   11-176175    7/1999
JP   2007-305204  11/2007

OTHER PUBLICATIONS
U.S. Appl. No. 12/544,349, filed Aug. 20, 2009, Takahiro Otsuka et al.

* cited by examiner

*Primary Examiner* — Hoai V Ho
*Assistant Examiner* — Anthan Tran
(74) *Attorney, Agent, or Firm* — Oblon, Spivak, McClelland, Maier & Neustadt, L.L.P.

(57) ABSTRACT

A nonvolatile semiconductor memory of an aspect of the present invention comprises a voltage step-down circuit including a first and a second circuit to achieve a voltage drop and configured to decrease the first voltage to a second voltage less than the first voltage, a transfer transistor to transfer the second voltage to a word line, and a control circuit to generate the second voltage as a first write voltage in a first mode wherein the first write voltage less than or equal to a prescribed magnitude is applied to the word line, and to generate the second voltage as a second write voltage in a second mode wherein the second write voltage greater than the prescribed magnitude is applied to the word line, wherein the difference between the first voltage and the second voltage is greater than or equal to the threshold voltage of the transfer transistor.

18 Claims, 8 Drawing Sheets

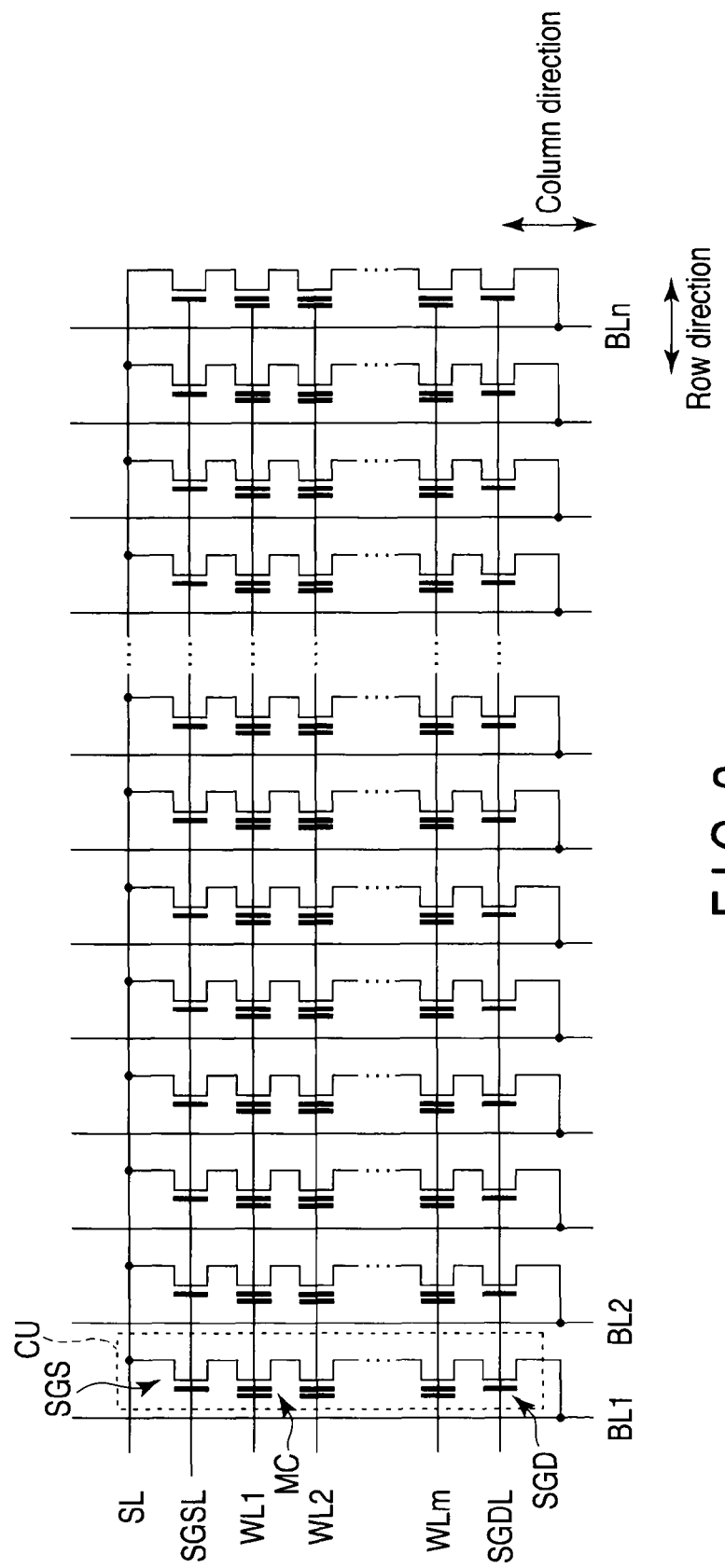
F I G. 2

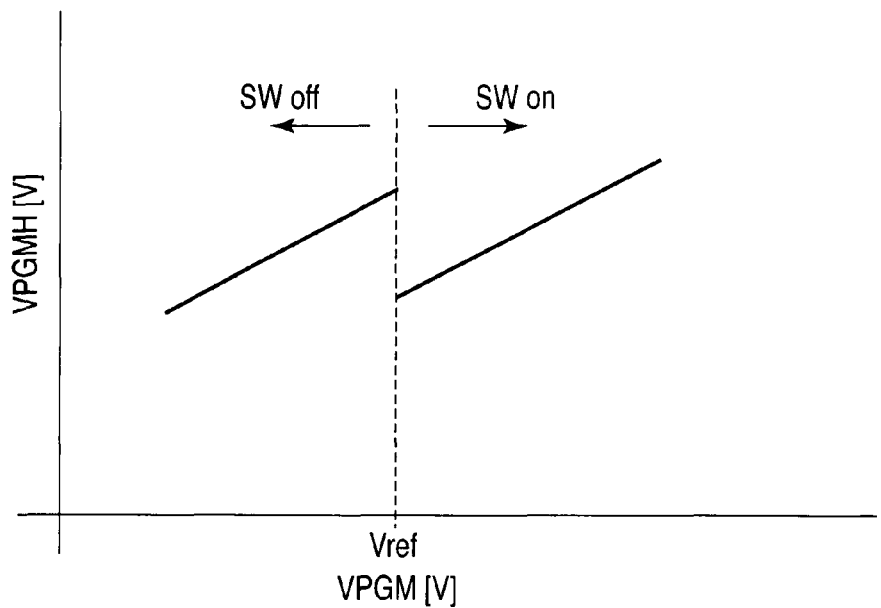
F I G. 10
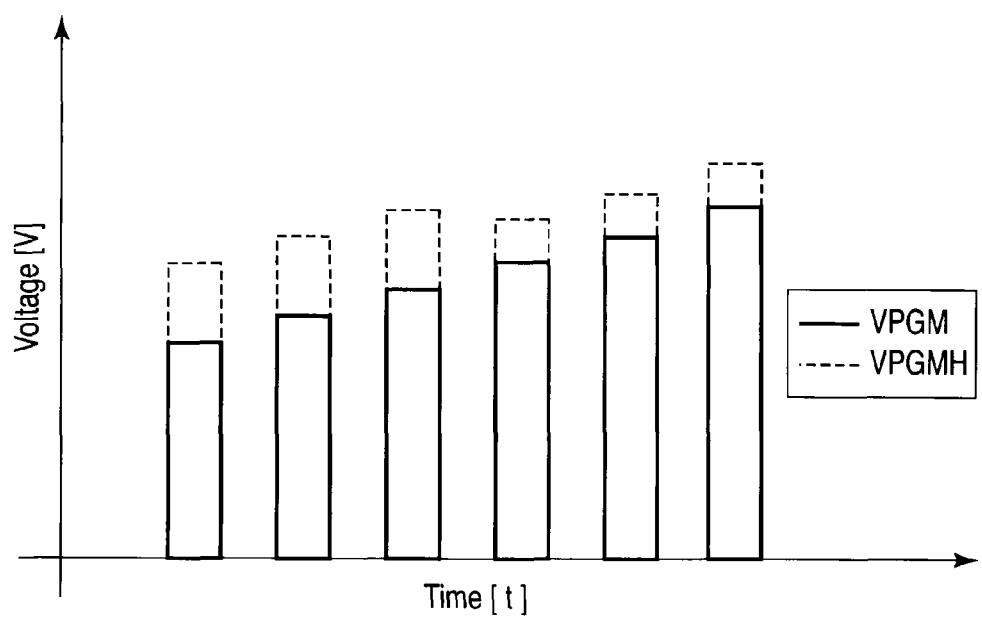
F I G. 11

NONVOLATILE SEMICONDUCTOR MEMORY

CROSS-REFERENCE TO RELATED APPLICATIONS

This application is based upon and claims the benefit of priority from prior Japanese Patent Application No. 2008-333954, filed Dec. 26, 2008, the entire contents of which are incorporated herein by reference.

BACKGROUND OF THE INVENTION

1. Field of the Invention

This invention relates to a nonvolatile semiconductor memory, more particularly to a NAND flash memory.

2. Description of the Related Art

Known as one type of a nonvolatile semiconductor memory is the NAND flash memory. The NAND flash memory has a transfer MOS transistor that transfers a transfer voltage to the word lines.

To write data to the memory cells, the gate voltage is applied to the gates of the transfer MOS transistor and the transfer voltage is transferred to the word lines via the transfer MOS transistor. The gate voltage and transfer voltage are generated by a voltage generating circuit.

The voltage generating circuit has a voltage step-up circuit. The voltage step-up circuit increases the power-supply voltage, generating the gate voltage to be applied to the gate of the transfer MOS transistor. The gate voltage increased by the voltage step-up circuit is decreased by a voltage step-down circuit, thereby providing a transfer voltage to be transferred to the word lines.

The gate voltage to be applied to the gates of the transfer MOS transistor to transfer the transfer voltage to the word lines should be greater than the sum of the transfer voltage and the threshold voltage of the transfer MOS transistor. Note that the gate voltage for the transfer MOS transistor is equal to the sum of the transfer voltage to be transferred to the word lines and the voltage drop achieved by the voltage step-down circuit.

Hence, to transfer the transfer voltage to the word lines, the voltage drop that the voltage step-down circuit achieve must be greater than or equal to the threshold voltage of the transfer MOS transistor.

BRIEF SUMMARY OF THE INVENTION

A nonvolatile semiconductor memory of an aspect of the present invention comprises: a voltage step-up circuit to generate a first voltage; a voltage step-down circuit including a first circuit to achieve a first voltage drop and a second circuit to achieve a second voltage drop and configured to decrease the first voltage to a second voltage less than the first voltage; a transfer transistor to receive the first voltage at its gate and to transfer the second voltage to a word line; and a control circuit to generate the second voltage as a first write voltage by the first and second circuit in a first mode wherein the first write voltage less than or equal to a prescribed magnitude is applied to the word line, and to generate the second voltage as a second write voltage by one of the first and second circuit in a second mode wherein the second write voltage greater than the prescribed magnitude is applied to the word line; wherein the difference between the first voltage and the second voltage is greater than or equal to the threshold voltage of the transfer transistor.

BRIEF DESCRIPTION OF THE SEVERAL VIEWS OF THE DRAWING

FIG. 2 is an equivalent circuit diagram showing the internal configuration of a memory cell array;

FIG. 10 is a diagram showing the relationship between voltage VPGMH and voltage VPGM in a second embodiment of this invention;

FIG. 11 is a diagram showing how voltage VPGM and voltage VPGMH change during the ordinary process of writing data.

DETAILED DESCRIPTION OF THE INVENTION

Figure 1:
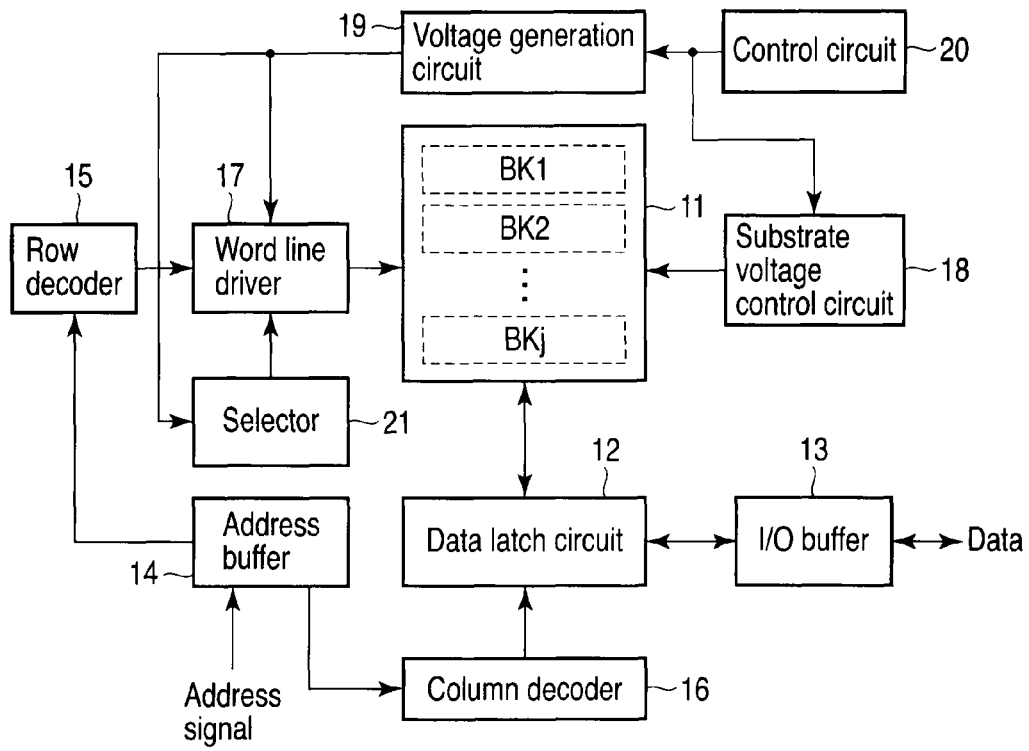
FIG. 1 is a block diagram of a flash memory.

The one mode of carrying out the present invention will be described in detail, with reference to the accompanying drawings.

1. Outline

Because of the problem concerning the breakdown voltage of nonvolatile semiconductor memories, the MOS transistors used in any voltage step-down circuit inevitably have a channel width greater than that of the transfer MOS transistor. In other words, the voltage drop that the voltage step-down circuit achieves is less than the threshold voltage of the transfer MOS transistor.

The voltage drop achieved by the voltage step-down circuit changes during manufacture or because of the conditions of use the circuit.

During the manufacture, for example, the voltage drop may vary because the transistor size changes or because a short-channel effect develops. During use, the voltage drop may decrease because of a temperature rise, as is known in the art. Therefore, the voltage drop achieved by the voltage step-down circuit must have a sufficient margin so that it may always be greater than or equal to the threshold voltage of the transfer MOS transistor.

This is why the voltage step-down circuit has a plurality of MOS transistors (step-down elements) that are connected in series.

MOS transistors are classified into two types: the enhancement (E) type, and the intrinsic (I) type. The threshold voltage of the I-type MOS transistor is less than that of the E-type. To adjust the voltage drop, it is desirable to use E- and I-type MOS transistors in combination. Thus, any ordinary voltage step-down circuit comprises E- and I-type MOS transistors.

Although the voltage step-down circuit is designed in consideration of all points described above, it may fail to achieve a voltage drop that is greater than or equal to the threshold voltage of the transfer MOS transistor.

To be more specific, the threshold voltage (voltage drops) of the E- and I-type MOS transistors are small if the transfer voltage to be transferred to the word lines is low.

Further, as the transfer voltage become less, the threshold voltage of the I-type MOS transistors decreases more than that of the E-type.

Consequently, a low voltage may be transferred to word lines to write data to a memory as in soft programming (see, for example, Jpn. Pat. Appln. KOKAI Publication No. 2007-305204 and Jpn. Pat. Appln. KOKAI Publication No. 11-176175). In this case, the threshold voltage of I-type MOS transistors will excessively decrease, and the voltage drop the voltage step-down circuit achieves may not be greater than the threshold voltage of the transfer MOS transistor. Therefore, a prescribed transfer voltage cannot be correctly transferred from the transfer MOS transistor to the word lines. Consequently, it takes much time to accomplish the soft programming, or the soft programming may not be completed at all.

In embodiments of this invention, the voltage step-down circuit includes a first circuit and a second circuit. The first circuit comprises, for example, an E-type MOS transistor that is diode-connected, each having gate and drain short-circuited. The second circuit comprises, for example, I-type MOS transistor that is diode-connected, each having gate and drain short-circuited.

The voltage step-down circuit has an MOS transistor that is used as a switch for the diode-connected MOS transistors provided in the second circuit. The MOS transistor functioning as switch short-circuits the source and drain of each diode-connected MOS transistor, in accordance with the operating state of the voltage step-down circuit.

The gate of the MOS transistor functioning as switch is applied with a voltage which has been generated by the local charge pump provided in the voltage step-up circuit and which has such a margin that the threshold voltage may not decrease.

The local charge pump operates under the control of a mode signal that represents the operating state of the chip. That is, the mode signal turns on or off the MOS transistor as switch. It is thus determined whether the source and drain of each diode-connected MOS transistor should be short-circuited.

For example, a signal representing a write mode is used as the mode signal. If the voltage to be transferred to the word lines is low, the switch is turned off, whereby the voltage to be input to the voltage step-down circuit is decreased by the first and second circuits. Conversely, if the voltage to be transferred to the word lines is high, the switch is turned on, whereby the voltage input to the voltage step-down circuit is decreased by the first circuit.

Hence, as the switch is turned on or off by the mode signal, the voltage step-down circuit decreases the input voltage to a magnitude greater than the threshold voltage of the transfer MOS transistor. As a result, the transfer voltage can be reliably transferred to the word lines in the nonvolatile semiconductor memory according to any embodiment of this invention.

2. Embodiments (1) Nonvolatile Semiconductor Memory

A NAND flash memory will be described as an example of a nonvolatile semiconductor memory according to this invention.

FIG. 1 is a block diagram showing the overall configuration of the NAND flash memory.

The memory cell array 11 of the NAND flash memory has a plurality of blocks BK1, BK2, ..., BLj. Each of the blocks BK1, BK2, ..., BLj has a plurality of NAND cell units.

FIG. 2 shows the configuration of a block and the configuration of a cell unit. In the NAND flash memory, each cell unit (hereinafter called NAND cell unit) CU is composed of a plurality of memory cells MC, a first select transistor STD, and a second select transistor STS. In each NAND cell unit CU, the memory cells MC are connected in series, constituting a so-called NAND string.

The memory cells MC are field-effect transistors, each having a laminated gate. That is, in each memory cell MC, the control gate is laid on a gate insulating film, which in turn is laid on the charge storage layer (e.g., floating gate). Word lines WL1, WL2, ..., WLm are connected to the control gates of the memory cells MC, respectively. In the flash memory, data can be discriminated, because the threshold voltage of each memory cell changes in accordance with the charge injected into the charge storage layer of the memory cell.

One end (i.e., source) of the current path of the first select transistor STD is connected to one end (i.e., drain) of the NAND string. The other end (i.e., drain) of the current path of the first select transistor STD is connected to a bit line BL.

One end (i.e., drain) of the current path of the second select transistor STS is connected to the other end (i.e., source) of the NAND string. The other end (i.e., source) of the current path of the second select transistor STS is connected to a source line SL.

Each block is composed a plurality of NAND cell units. These NAND cell units are arranged in the row direction.

The word lines WL1, WL2, ..., WLm and the source line SL extend in the row direction. Each word line WL is shared by a plurality of memory cells MC arranged in the row direction. Transfer transistors are connected, respectively to one end of the word line WL1, one end of the word line WL2, ... and one end of the word line WLm. One source line SL is shared by a plurality of NAND cell units that are arranged in the row direction.

Bit lines BL1, BL2, ..., BLn extend in the column direction. The bit lines BL1, BL2, ..., BLn are connected to the NAND cell units CU, respectively.

Two select gate lines SGDL and SGSL extend in the row direction. The select gate lines SGDL on the drain side is connected to the gates of a plurality of select transistors SGD that are arranged in the row direction. The select gate lines SGSL on the source side are connected to the gates of a plurality of select transistors SGS that are arranged in the row direction.

As shown in FIG. 1, a data latch circuit 12 is provided. The data latch circuit 12 has the function of temporarily latching data at the time of read/write programming. The data latch circuit 12 is constituted by, for example, a flip-flop circuit. An input/output (I/O) buffer 13 is provided, which functions as data interface circuit. An address buffer 14 is provided, which functions as address-signal interface circuit.

The address signals include a block address signal, a row address signal, and a column address signal.

A row decoder 15 is provided, which selects one of the blocks BK1, BK2, . . . , BLj in accordance with a block address signal, and selects one of the word lines provided in the block thus selected, in accordance with a row address signal. A word line driver 17 is provided, which drives the word lines provided in the block selected.

A column decoder 16 is provided, which selects one of a plurality of bit lines in accordance with a column address signal.

A substrate voltage control circuit 18 is provided, which controls the voltage in the semiconductor substrate of the NAND flash memory. The semiconductor substrate has wells.

A voltage generation circuit 19 is provided, which generates a potential that controls the word line driver 17 and another potential that should be applied to the word lines provided in the block selected and to the two select gate lines selected.

For example, to write data to a memory cell, the voltage generation circuit 19 generates a gate voltage VPGMH and a transfer voltage VPGM. The gate voltage VPGMH is transferred to the gate of any transfer MOS transistor selected. The transfer voltage VPGM is transferred to any word line selected via the transfer MOS transistor.

A control circuit 20 is provided, which controls the substrate voltage control circuit 18 and the voltage generation circuit 19.

Further, the control circuit 20 transmits a mode signal to the local charge pump provided in the voltage step-down circuit so that data may be written to the memory cells MC. The mode signal represents the operating mode used to write data.

A selector 21 is provided, which selects a magnitude for the transfer voltage to be applied to the word lines WL1, WL2, . . . , WLm provided in the block selected, in accordance with information such as the operating mode or the position (address) of the word line selected.

Figure 3:
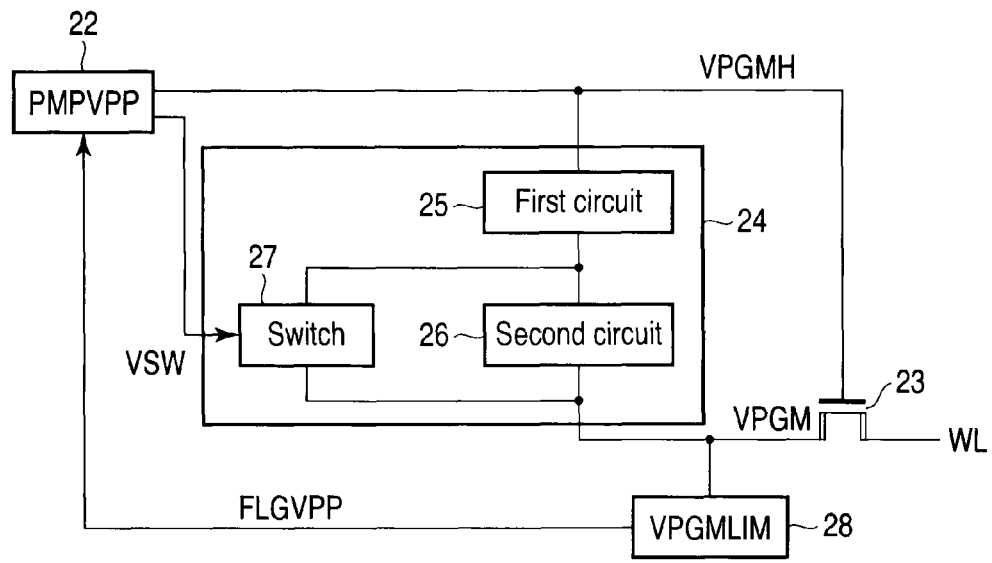
FIG. 3 is a diagram illustrating an exemplary internal configuration of the voltage generation circuit shown in FIG. 1.

FIG. 3 shows exemplary configurations of the voltage step-up circuit 22, voltage step-down circuit 24 and limiter 28, which are all incorporated in the generation circuit 19.

To write data to a memory cell, the voltage step-up circuit 22 increases the power-supply voltage, generating a gate voltage VPGMH. The gate voltage VPGMH will be applied to the gate of a transfer MOS transistor 23.

The transfer MOS transistor 23 is a field effect transistor (MOS transistor) having the high-breakdown voltage type that can transfer voltages greater than the power-supply voltage.

The voltage step-down circuit 24 includes a first circuit 25, a second circuit 26, and a switch 27. The switch 27 has the function of short-circuiting the current path of the second circuit 26.

In the voltage step-down circuit 24, the first circuit 25 and the second circuit 26 cooperate to decrease the voltage VPGMH output from the voltage step-up circuit 22, thereby generating voltage VPGM. The voltage VPGM (hereinafter called transfer voltage), thus generated, is transferred to a word line WL via the transfer MOS transistor 23.

More precisely, the transfer voltage VPGM is first applied to one end of the current path of the transfer MOS transistor 23. The transfer voltage VPGM is then applied via the channel of the transfer MOS transistor 23, which is now in on-state, to the word line WL connected to the other end of the current path of the transfer MOS transistor 23. The transfer voltage VPGM is so applied as write voltage to, for example, the word line WL to which the memory cell that should store the data is connected.

The limiter 28 detects whether the transfer voltage VPGM is a voltage of a prescribed magnitude. If the transfer voltage VPGM does not have the prescribed magnitude, a voltage step-up circuit control signal FLGVPP is output to the voltage step-up circuit 22. Controlled by the control signal FLGVPP, the voltage step-up circuit 22 adjusts the gate voltage VPGMH to a prescribed magnitude.

The voltage drop Vd achieved in the voltage step-down circuit 24 is given as: Vd=VPGMH−VPGM. To transfer the transfer voltage VPGM to the word line WL, it is desired that VPGMH≧VPGM+Vth, where Vth is the threshold voltage of the transfer MOS transistor 23. To satisfy this relationship, the voltage drop Vd must be greater than or equal to Vth.

(2) Voltage Step-Down Circuit

Figure 4:
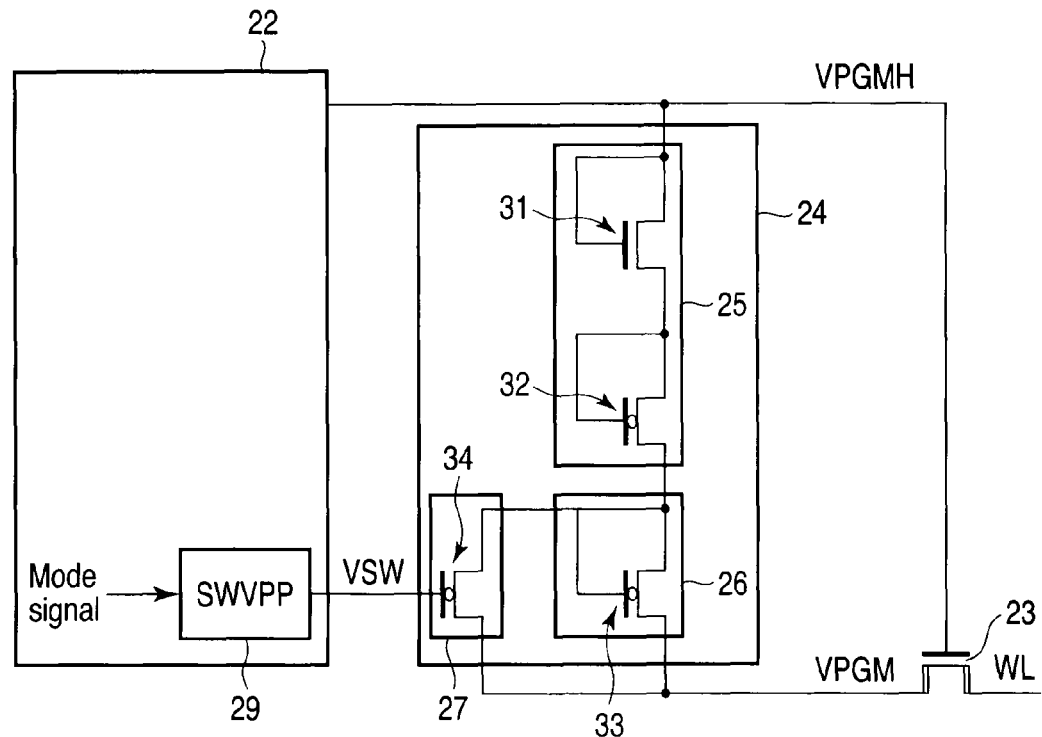
FIG. 4 is a diagram showing a voltage step-down circuit according to an embodiment of this invention.

FIG. 4 is a diagram showing an exemplary voltage step-down circuit 24 according to an embodiment of this invention.

In the voltage step-down circuit 24, the first circuit 25 comprises a diode-connected E-type MOS transistor 31 and diode-connected I-type MOS transistor 32, and the second circuit 26 comprises a diode-connected I-type MOS transistor 33.

The first and second circuits 25 and 26, more precisely the three diode-connected MOS transistors 31, 32 and 33, have their current paths connected in series. The MOS transistors 31, 32 and 33 are, for example, n-channel transistors.

In the voltage step-down circuit 24, a switch 27 is further provided. The switch 27 is, for example, an I-type MOS transistor 34. The switch 27 comprising the I-type MOS transistor 34 functions as a switch for the I-type MOS transistor 33 that constitutes the second circuit 26. The I-type MOS transistor 34, which functions as switch 27, short-circuits the source and drain of the I-type MOS transistor 33 that operates as second circuit 26.

To the gate of the I-type MOS transistor 34, a voltage VSW is applied. This voltage VSW has been generated by the local charge pump 29 that is provided in the voltage step-up circuit 22. The voltage VSW is greater than or equal to the sum of the drain voltage of the I-type MOS transistor 33 and the threshold voltage of the I-type MOS transistor 34.

The local charge pump 29 is controlled by a mode signal input to it. That is, the switch 27 is turned on or off in accordance with the mode signal.

While the switch 27 remains on, the source and drain of the I-type MOS transistor 33 of the second circuit 26 are short-circuited. In this case, the voltage step-down circuit 24 is so configured that the two diode-connected MOS transistors 31 and 32 function as a load to voltage VPGMH. Conversely, while the switch 27 remains off, the voltage step-down circuit 24 is so configured that the source and drain of the I-type MOS transistor 33 of the second circuit 26 and the MOS transistor 33 of the second circuit function as a load of the voltage VPGMH.

Since the first circuit 25 decreases the voltage VPGMH, the threshold voltage of the MOS transistor 33 constituting the second circuit 26 decreases, but a little. The voltage VSW applied to the gate of the I-type MOS transistor 34 functioning as switch 27 can therefore be decreased. Hence, the voltage VSW can be less in the voltage step-down circuit 24 than in the case where a switch is provided for the second circuit 25. Nonetheless, the switch may be designed to short-circuit the MOS transistors provided in the first circuit, if necessary in specific conditions.

(3) First Embodiment

In a first embodiment of this invention, two mode signals are used, designating the soft programming mode and the ordinary data write mode, respectively. The control circuit 20 controls the local charge pump in response to these mode signals.

Note that in the ordinary data write mode, the threshold voltage of any memory cell in which data has been erased is increased to a prescribed positive magnitude, thereby to write data to this memory cell. In the soft programming mode, the data is first erased in memory cells, a write voltage less than the voltage used in the ordinary data writing is then used to minutely adjust the threshold voltage of the over-erased memory cell, which has a threshold voltage of a excessive negative magnitude among the erased-state memory cells, by a writing before writing prescribed data to the memory.

The local charge pump is controlled as follows. In the ordinary write mode (using a write voltage of, for example, 16V to 26.6V), the local charge pump 29 is driven to turn the switch 27 on. In the soft programming mode (using a write voltage of, for example, 5 to 18.4V), the switch 27 is turned off, without driving the local charge pump 29.

In the ordinary write mode, the two diode-connected MOS transistors 31 and 32 provided in the first circuit 25 decrease the gate voltage VPGMH, to prevent the voltage VPGM from becoming excessively high.

The voltage thus decreased by the first circuit 25 is applied to one end of the MOS transistor 34 used as switch 27 and to the gate and drain of the diode-connected MOS transistor 33. The voltage decreased by the first circuit 25 is divided and applied to the switch 27 in on-state and to the second circuit 26. If the voltage transfer ability of the transistor 34 used as switch 27 is much greater than the voltage transfer ability of the diode-connected MOS transistor 33, a greater part of the voltage decreased by the first circuit 25 will be applied via the switch 27 in on state (i.e., MOS transistor 34) to one end of the current path of the transfer MOS transistor 23. In this case, the function of the MOS transistor 33 working as a load for decreasing the voltage VPGMH diminishes. The voltage decreased by the two diode-connected MOS transistors 31 and 32 is therefore applied, as write voltage (second write voltage), to one end of the current path of the transfer MOS transistor 23.

In the soft programming mode, the three diode-connected MOS transistors 31, 32 and 33, i.e., two transistor of the first circuit and one transistor of the second circuit, decrease the voltage VPGMH to prevent the threshold voltage of the I-type MOS transistors from being decreased too much. The voltage thus decreased by the three diode-connected MOS transistors 31, 32 and 33 is applied, as write voltage (first write voltage) to one end of the current path of the transfer MOS transistor 23. In this case, the I-type MOS transistor 34, functioning as switch 27, is off. Therefore, in practice, the output voltage of the first circuit 25 is not transferred to the transfer MOS transistor 23 via the MOS transistor 34.

The voltage drop that the voltage step-down circuit 24 achieves while the switch 27 remains off as described above in the soft programming mode is therefore greater than the voltage drop achieved while the switch 27 remains on as in the ordinary write mode.

Figure 5:
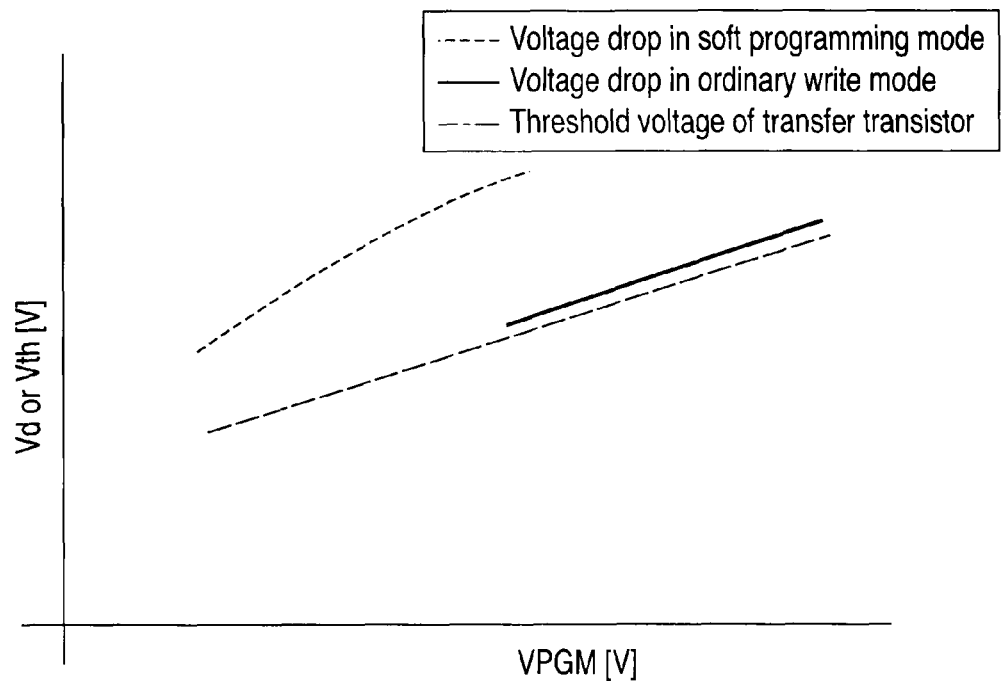
FIG. 5 is a diagram showing the relationship between voltage drop Vd and voltage VPGM in the ordinary write mode, the relationship between voltage drop Vd and voltage VPGM in the soft programming mode, and the relationship between the threshold voltage Vth of transfer MOS transistor and voltage VPGM.

FIG. 5 is a diagram showing the relationship between voltage drop Vd and voltage VPGM in the ordinary write mode, the relationship between voltage drop Vd and voltage VPGM in the soft programming mode, and the relationship between the threshold voltage Vth of transfer MOS transistor and voltage VPGM.

As can be seen from FIG. 5, the voltage drop Vd is always greater than the threshold voltage Vth of the transfer MOS transistor even if the transfer voltage VPGM changes as the operating mode is switched to the soft programming mode or to the ordinary write mode.

Therefore, an appropriate voltage drop Vd can be achieved in either write mode. The transfer voltage can be reliably transferred to the word lines via the transfer MOS transistor.

The threshold voltage of the diode-connected MOS transistors 31, 32 and 33, provided in the voltage step-down circuit 24, may change from the design value during manufacture or may change during use because of temperature changes. Consequently, the voltage drop Vd may become smaller than the threshold voltage of the transfer MOS transistor 23 in some cases.

Figure 6:
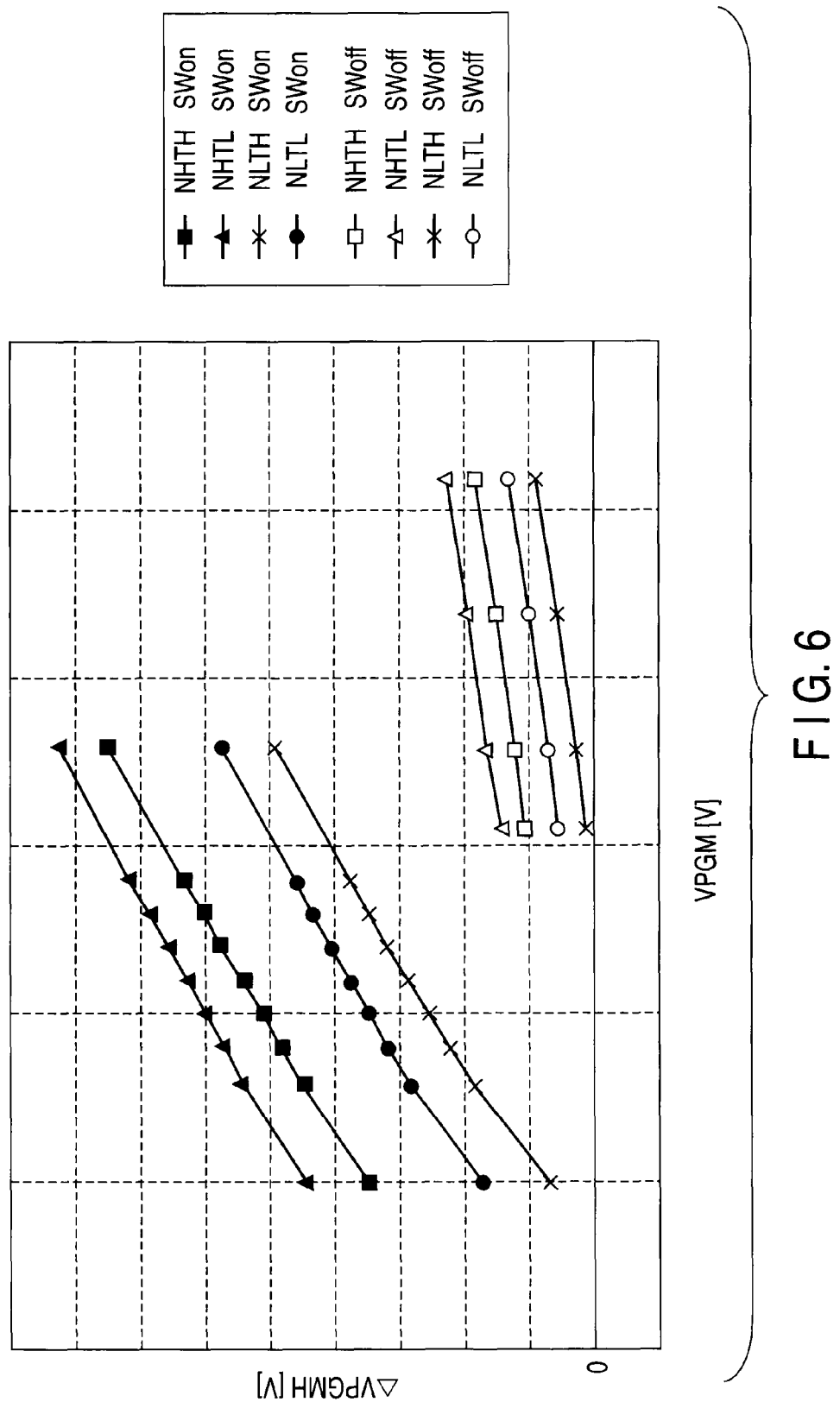
FIG. 6 is a diagram showing the relationship between voltage ΔVPGMH and voltage VPGM.

FIG. 6 is a diagram showing the relationship between voltage ΔVPGMH and the transfer voltage VPGM when the threshold voltage of the diode-connected MOS transistors changes and when the temperature changes. Note that ΔVPGMH is the difference between the voltage drop Vd and the threshold voltage Vth of the transfer MOS transistor.

In FIG. 6, NH and NL designate, respectively the case where the diode-connected MOS transistors have a high threshold voltage and the case where they have a low threshold voltage. In FIG. 6, too, TH and TL designate, respectively, the case where the temperature during the operation is high and the case where the temperature is low during the operation.

The four lines illustrated in FIG. 6 indicate, respectively the case (NHTH) where both the threshold voltage and the temperature are high, the case (NHTL) where the threshold voltage is high and the temperature is low, the case (NLTH) where the threshold voltage is low and the temperature is high, and the case (NLTL) where both the threshold voltage and the temperature are low. In FIG. 6, SWon means that the switch 27 is on, whereas SWoff means that the switch 27 is off.

As can be seen from FIG. 6, ΔVPGMH has a positive magnitude at all times even if the voltage drop achieved by the voltage step-down circuit 24 is small because, for example, the transistors have a low threshold voltage and the temperature is high during the operation (that is, in the case NLTH). In other words, as shown in FIG. 6, the voltage drop Vd is greater than the threshold voltage Vth of the transfer MOS transistor, in whichever conditions, in the nonvolatile semiconductor memory according to this embodiment.

Figure 7:
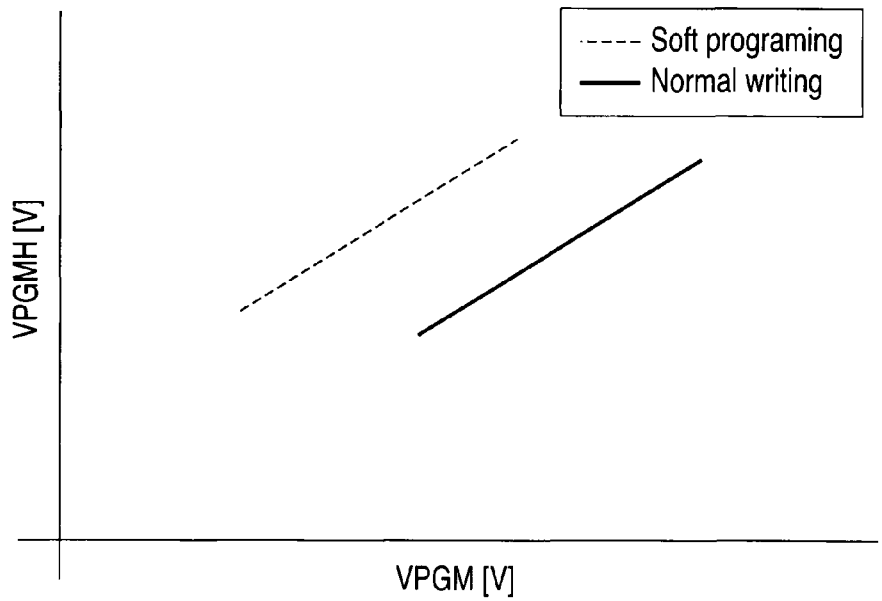
FIG. 7 is a diagram showing the relationship between voltage VPGMH and voltage VPGM in a first embodiment of this invention.

The switch 27 is turned on or off, or is controlled in one way in the soft programming mode, and in another way in the ordinary write mode. Therefore, as shown in FIG. 7, the gate voltage VPGMH applied to the gate of the transfer MOS transistor 23 has one magnitude in the soft programming mode and another magnitude in the ordinary write mode, though it is applied to generate the same transfer voltage VPGM. In other words, two voltages VPGM of different magnitudes can be obtained for one gate voltage VPGMH, respectively in accordance with two write modes.

In the nonvolatile semiconductor memory according to the first embodiment (for example, NAND flash memory), the control circuit 20 turns the switch 27 on or off as described above, in accordance with the mode signal designates the soft programming mode or the ordinary write mode. More precisely, in the soft programming mode, the control circuit 20 turns the switch 27 off, whereby the voltage step-down circuit 24 decreases the voltage VPGMH by using the two diode-connected MOS transistors 31 and 32 provided in the first circuit 25 and one diode-connected MOS 33 provided in the second circuit 26. In the ordinary write mode, the control circuit 20 turns the switch 27 on, whereby the voltage step-down circuit 24 decreases the voltage VPGMH by using two diode-connected MOS transistors 31 and 32 provided in the first circuit 25.

In either wiring mode, an appropriate voltage drop can be achieved. The voltage drop Vd achieved by the voltage step-down circuit 24 is greater than the threshold voltage Vth of the transfer MOS transistor 23 at all times.

Therefore, the transfer voltage can be reliably transferred to the word lines in the nonvolatile semiconductor memory according to the first embodiment.

(4) Second Embodiment

In a second embodiment of this invention, a mode signal is used, designating so-called step-up write mode, and the control circuit 20 controls the local charge pump in accordance with the magnitude of the transfer voltage VPGM. The step-up write mode is an operating mode in which a write pulse (first write pulse) of the initial write voltage is first applied to any memory cell, and another write pulse (second write pulse) is then repeatedly applied to the memory cell, each time at a voltage greater than that the immediately preceding it.

If the transfer voltage VPGM is less than or equal to a prescribed magnitude (for example, 20V), the switch 27 will be turned off. If the transfer voltage VPGM is greater than the prescribed magnitude, the switch 27 will be turned on.

To be more specific, if the transfer voltage VPGM is less than or equal to the prescribed magnitude, the control circuit 20 will decrease the voltage VPGMH by using the three diode-connected MOS transistors 31, 32 and 33, i.e., two transistors 31 and 32 provided in the first circuit and one transistor 33 provided in the second circuit, to prevent the threshold voltage of the I-type MOS transistors from being decreased too much.

Conversely, if the transfer voltage VPGM is greater than the prescribed magnitude, the control circuit 20 will decrease the voltage VPGMH by using the two diode-connected MOS transistors 31 and 32, both provided in the first circuit, to decrease the voltage VPGMH.

Thus, the second embodiment differs in the following respect from the first embodiment wherein the switch is changed over in accordance with the ordinary write mode or the soft programming mode. That is, in either write mode (ordinary write mode or soft programming mode), the three diode-connected MOS transistors 31, 32 and 33 achieve a voltage drop if the transfer voltage VPGM is smaller than a prescribed magnitude, and the two diode-connected MOS transistors 31 and 32 achieve a voltage drop if the transfer voltage VPGM is greater than the prescribed magnitude.

Figure 8:
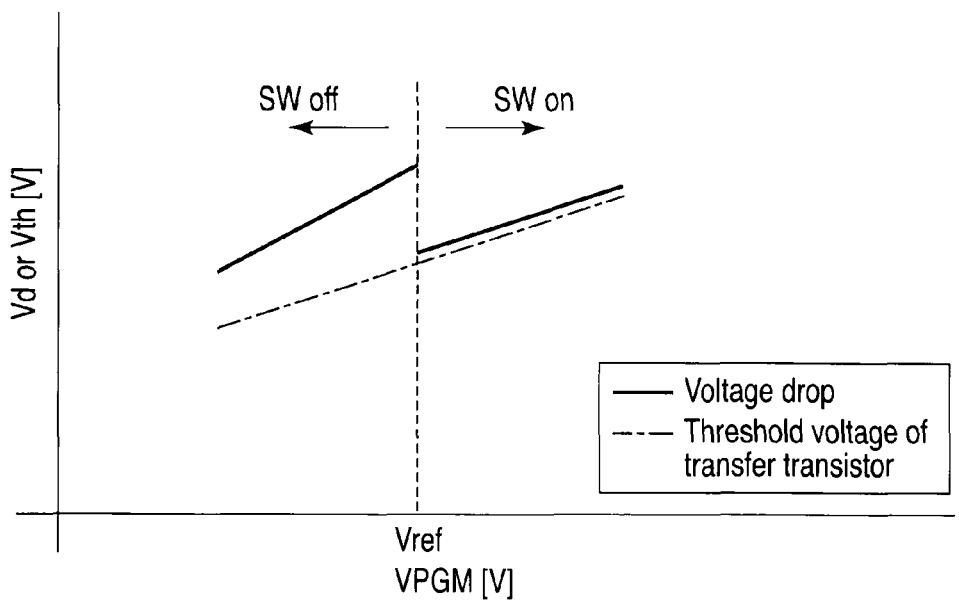
FIG. 8 is a diagram showing the relationship between voltage drop Vd and voltage VPGM and the relationship between the threshold voltage Vth of a transfer MOS transistor and voltage VPGM.

FIG. 8 shows the respective relationships between the threshold voltage Vth of transfer MOS transistor 23 and the voltage drop Vd according to voltage VPGM.

As can be seen from FIG. 8, the voltage drop Vd is greater than the threshold voltage Vth of the transfer MOS transistor 23, whatever magnitude the transfer voltage VPGM has with respect to a prescribed voltage Vref, when the switch 27 is turned on or off in accordance with whether the transfer voltage VPGM is greater or less than the prescribed voltage Vref.

Hence, if the switch 27 is turned on or off in accordance with the magnitude of the prescribed transfer voltage VPGM, an appropriate voltage drop will be obtained. The transfer voltage VPGM can therefore be reliably transferred to the word lines WL via the transfer MOS transistor 23.

However, the threshold voltage of the diode-connected MOS transistors 31, 32 and 33 provided in the voltage step-down circuit 24 may change during manufacture of these transistors or because of a temperature change in use. In this case, the voltage drop Vd achieved by the voltage step-down circuit 24 may become less than the threshold voltage Vth of the transfer MOS transistor 23.

Figure 9:
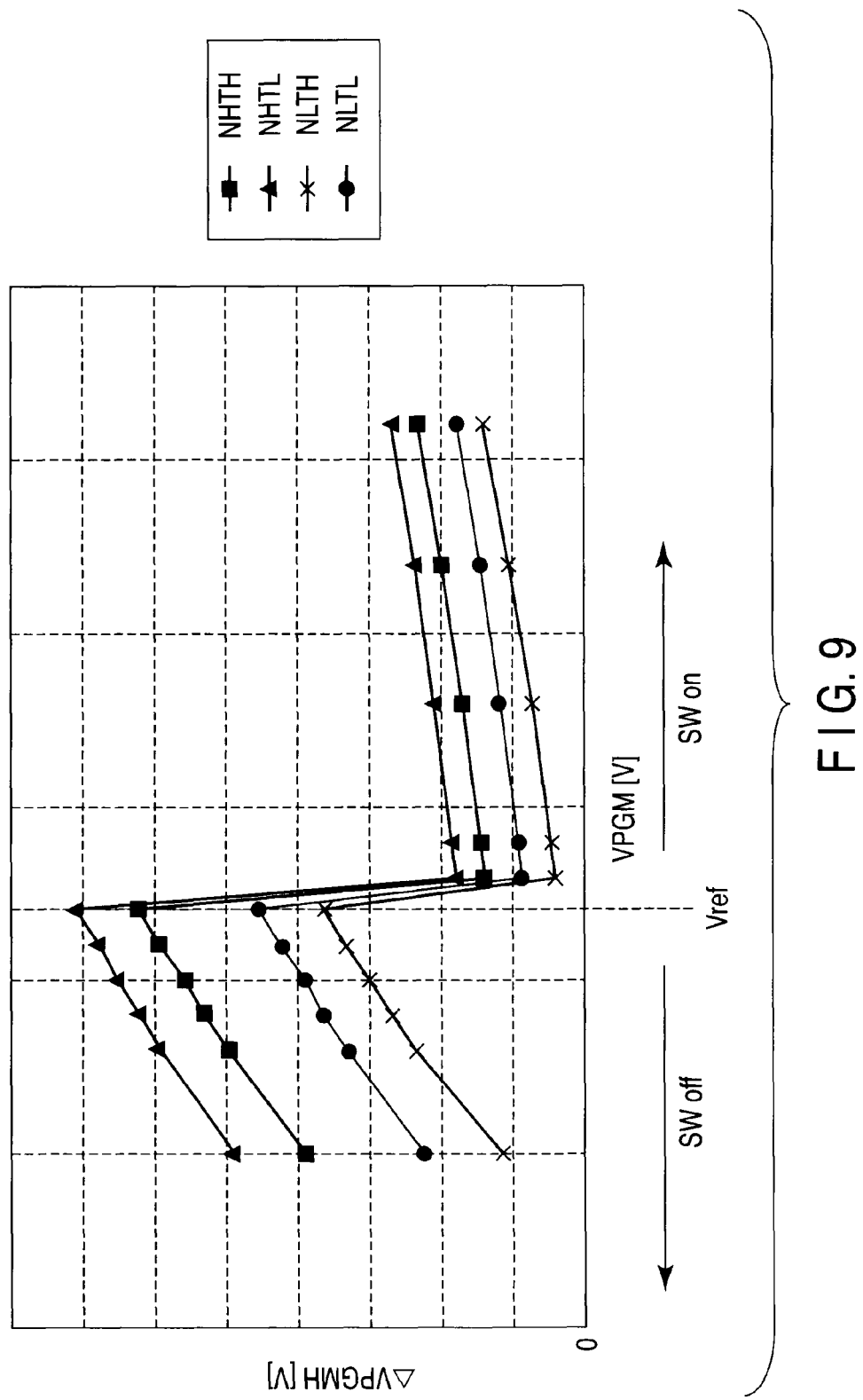
FIG. 9 is a diagram showing the relationship between voltage ΔVPGMH and voltage VPGM.

FIG. 9 shows the relationship between voltage $\Delta$VPGMH and voltage VPGM when the threshold voltage of the diode-connected MOS transistors and the temperature change. The lines shown in FIG. 9 indicate the same cases as explained with reference to FIG. 6. As may be understood from FIG. 9, the switch is turned on or off, in accordance with whether the voltage VPGM is less than lower than 12V or is 12V or greater.

As shown in FIG. 9, $\Delta$VPGMH have a positive magnitude at all times, even if the transistors have a low threshold voltage and the temperature is low (that is, in the case NLTH), inevitably reducing the voltage drop achieved by the voltage step-down circuit 24. In other words, the voltage drop Vd is greater than the threshold voltage Vth of the transfer MOS transistor 23, in whichever conditions, in the nonvolatile semiconductor memory according to this embodiment.

As indicated above, the switch 27 is turned on or off in accordance with the magnitude of the transfer voltage VPGM. The transfer voltage VPGM used as a reference for changing over the switch 27 can therefore be set to a small value even if the operating conditions become worse. Hence, the nonvolatile semiconductor memory according to this embodiment is advantageous in that a sufficient voltage drop Vd can be attained even if the operating conditions become worse.

Moreover, the switch 27 is turned on or off in accordance with the magnitude of the transfer voltage VPGM while the data is written in the step-up write mode.

Therefore, the gate voltage VPGMH greatly changes as can be seen from FIG. 10, in accordance whether the transfer voltage VPGM is greater or less than the prescribed voltage Vref.

FIG. 11 shows how the transfer voltage VPGM and the gate voltage VPGMH change with time in order to write data to any memory cell in the step-up write mode.

As shown in FIG. 10 and FIG. 11, the switch 27 is turned on or off in accordance with the magnitude of voltage VPGM. Therefore, the gate voltage VPGMH does not keep increasing in the step-up write mode and may decrease in a time or voltage when the switch 27 is turned on or off.

In the nonvolatile semiconductor memory (e.g., NAND flash memory) according to the second embodiment, the mode signal designating the step-up write mode is used and the switch 27 is turned on or off as described above, in accordance with the magnitude of the transfer voltage VPGM.

That is, if the transfer voltage VPGM is less than or equal to the prescribed voltage Vref, the control circuit 20 will turn off the switch 27. Thus, the voltage step-down circuit 24 decreases the voltage VPGMH to the voltage VPGM, using the three diode-connected MOS transistors, i.e., transistors 31 and 32 provided in the first circuit and transistor 33 provided in the second circuit.

On the other hand, if the transfer voltage VPGM is greater than the prescribed voltage Vref, the control circuit 20 will turn on the switch 27. In this case, the voltage step-down circuit 24 decreases the voltage VPGMH, using the two diode-connected MOS transistors 31 and 32 that are provided in the first circuit.

An appropriate voltage drop Vd is thereby achieved as required at the transfer voltage VPGM. The voltage drop Vd is always larger than the threshold voltage Vth of the transfer MOS transistor.

Hence, the transfer voltage can be reliably transferred to the word lines via the transfer MOS transistor in the nonvolatile semiconductor memory according to the second embodiment.

3. Modifications

In any embodiment described above, all diode-connected MOS transistors used in the voltage step-down circuit may be of the E, I, or depletion (D) type MOS transistors.

Figure 12:
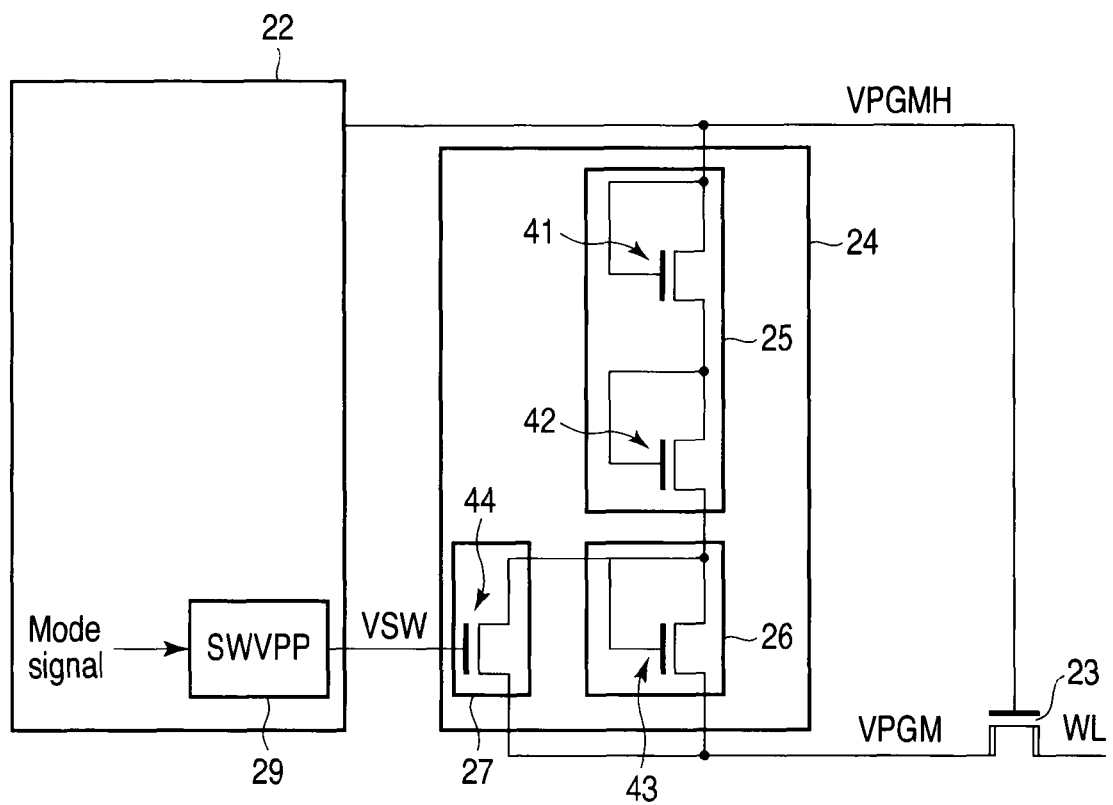
FIG. 12 is a diagram illustrating an exemplary voltage step-down circuit that may be used in the invention.

For example, as shown in FIG. 12, E-type MOS transistors 41, 42, 43 and 44 may constitute the first circuit 25, second circuit 26 and switch 27. In this case, the voltage step-down circuit 24 can be manufactured in fewer steps and can be made smaller than otherwise.

The voltage-decreasing elements used are not limited to diode-connected MOS transistors. Diode elements, resistor elements, or a combination of these may be used to constitute a voltage step-down circuit.

Moreover, the number of voltage-decreasing elements used is not limited to three. Four, five or more elements may be used, as needed, to constitute a circuit (switch) that short-circuits one or more voltage-decreasing elements.

4. Summary

In this invention, the transfer voltage can be reliably transferred to the word lines, regardless of the magnitude of the transfer voltage.

The embodiments of the invention, described above, are flash memories. The voltage step-down circuit incorporated in any embodiment described above can be used in resistance random access memories, such as a PCRAM or ReRAM. The resistance random access memory stores data in the form of the resistance changes in the storage elements. Each storage element of any resistance random access memory has its resistance reversibly changed in accordance with the shape (voltage or pulse width) of the pulse applied to it, and holds the resistance change in nonvolatile fashion. Furthermore, any embodiment of this invention, described above, can be applied to a resistance random access memory that has storage elements, each having its resistance reversibly changed in accordance with the voltage applied to it (first or second write voltage).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a voltage step-up circuit to generate a first voltage;
a voltage step-down circuit including a first circuit to achieve a first voltage drop and a second circuit to achieve a second voltage drop and configured to decrease the first voltage to a second voltage less than the first voltage;
a transfer transistor to receive the first voltage at its gate and to transfer the second voltage to a word line; and
a control circuit to generate the second voltage as a first write voltage by the first and second circuit in a first mode wherein the first write voltage less than or equal to a prescribed magnitude is applied to the word line, and to generate the second voltage as a second write voltage by one of the first and second circuits in a second mode wherein the second write voltage greater than the prescribed magnitude is applied to the word line;
wherein the difference between the first voltage and the second voltage is greater than or equal to the threshold voltage of the transfer transistor.

2. The nonvolatile semiconductor memory according to claim 1, wherein the first and second circuits are connected in series in the voltage step-down circuit.

3. The nonvolatile semiconductor memory according to claim 2, wherein the second circuit includes a first MOS transistor, and the first MOS transistor has a gate and drain connected to each other.

4. The nonvolatile semiconductor memory according to claim 3, further comprising a switch connected between a source and the drain of the first MOS transistor and controlled by a mode signal which selects one of the first and second modes.

5. The nonvolatile semiconductor memory according to claim 4, wherein the switch includes a second MOS transistor, and a third voltage is applied to the gate of the second MOS transistor while the second MOS transistor remains on.

6. The nonvolatile semiconductor memory according to claim 4, wherein the switch is turned on when the mode signal designates the second mode.

7. The nonvolatile semiconductor memory according to claim 5, wherein the third voltage is greater than or equal to a sum of a drain voltage of the first MOS transistor and a threshold voltage of the second MOS transistor.

8. The nonvolatile semiconductor memory according to claim 2, wherein the first circuit includes a third MOS transistor and a fourth MOS transistor, a gate and drain of the third MOS transistor are connected, a gate and drain of the fourth MOS transistor are connected, and a current path of the third MOS transistor is connected in series to a current path of the fourth MOS transistor.

9. The nonvolatile semiconductor memory according to claim 8, wherein the fourth MOS transistor has a lower threshold voltage than the third MOS transistor.

10. The nonvolatile semiconductor memory according to claim 9, wherein the third MOS transistor is of an enhancement type, and the fourth MOS transistor is of an intrinsic type.

11. The nonvolatile semiconductor memory according to claim 3, wherein the first MOS transistor is of an intrinsic type.

12. The nonvolatile semiconductor memory according to claim 1, further comprising a limiter determining whether the second voltage have the prescribed value or not.

13. The nonvolatile semiconductor memory according to claim 12, wherein when the second voltage does not have the prescribed magnitude, the limiter outputs a control signal to adjust the first voltage to the voltage step-up circuit.

14. The nonvolatile semiconductor memory according to claim 5, wherein the voltage step-up circuit has a charge pump to generate the third voltage.

15. The nonvolatile semiconductor memory according to claim 1, further comprising a memory cell array having a plurality of memory cells which are connected to the word line.

16. The nonvolatile semiconductor memory according to claim 1, wherein the first mode involves writing data to a memory cell in over-erased state, and the second mode is an ordinary write mode.

17. The nonvolatile semiconductor memory according to claim 1, wherein the first mode is a first step of step-up writing, and the second mode is a second step performed after the first step.

18. The nonvolatile semiconductor memory according to claim 1, further comprising a switch connected in parallel with a current path of the second circuit and controlled by a mode signal input externally and designating the first mode or the second mode, wherein the switch short-circuits the current path of the second circuit when the mode signal designates the second mode.

* * * * *